(12) United States Patent
Sarginger

(10) Patent No.: US 8,437,134 B2
(45) Date of Patent: May 7, 2013

(54) HOUSING STRUCTURE FOR VEHICLE ELECTRONIC CONTROL UNIT

(75) Inventor: Fred H. Sarginger, Columbus, OH (US)

(73) Assignee: Honda Motor Co., Ltd., Tokyo (JP)

( * ) Notice: Subject to any disclaimer, the term of this patent is extended or adjusted under 35 U.S.C. 154(b) by 187 days.

(21) Appl. No.: 12/686,874

(22) Filed: Jan. 13, 2010

(65) Prior Publication Data

US 2011/0170260 A1 Jul. 14, 2011

(51) Int. Cl.
*H05K 7/20* (2006.01)

(52) U.S. Cl.
USPC ........... 361/688; 361/600; 361/693; 361/752; 361/802; 361/831; 174/17 VA; 174/541; 174/547

(58) Field of Classification Search .......................... None
See application file for complete search history.

(56) References Cited

U.S. PATENT DOCUMENTS

| | | | |
|---|---|---|---|
| 5,239,446 A * | 8/1993 | Matsumura et al. .......... | 361/736 |
| 5,334,799 A * | 8/1994 | Naito et al. ............... | 174/17 VA |
| 5,789,704 A | 8/1998 | Kawakita | |
| 6,008,454 A | 12/1999 | Kawakita | |
| 6,144,522 A | 11/2000 | Myokan et al. | |
| 6,180,880 B1 * | 1/2001 | Loibl et al. ..................... | 174/541 |
| 7,189,918 B2 | 3/2007 | Sakata | |
| 2003/0147204 A1 * | 8/2003 | Koike et al. ................... | 361/600 |
| 2005/0269321 A1 | 12/2005 | Bornhof et al. | |
| 2010/0018892 A1 * | 1/2010 | Kohmura et al. ............. | 206/706 |
| 2010/0155035 A1 * | 6/2010 | Ishida et al. ............. | 165/104.31 |

FOREIGN PATENT DOCUMENTS

| | | |
|---|---|---|
| JP | 8236953 | 9/1996 |
| JP | 2002353675 | 12/2002 |
| JP | 200490875 | 3/2004 |

* cited by examiner

Primary Examiner — Courtney Smith
(74) Attorney, Agent, or Firm — Rankin, Hill & Clark LLP

(57) ABSTRACT

A housing structure for a vehicle electronic control unit ("ECU") includes an ECU case, a mounting bracket, and a seal ring. The ECU case is for housing a vehicle ECU and includes a ventilation opening. The mounting bracket connects with the ECU case and is configured to connect with an associated vehicle frame for mounting the ECU case to the associated vehicle frame. The seal ring surrounds the ventilation opening and seals against both the ECU case and the mounting bracket. A method for mounting an electronic control unit ("ECU") case to a vehicle frame is also disclosed.

19 Claims, 5 Drawing Sheets

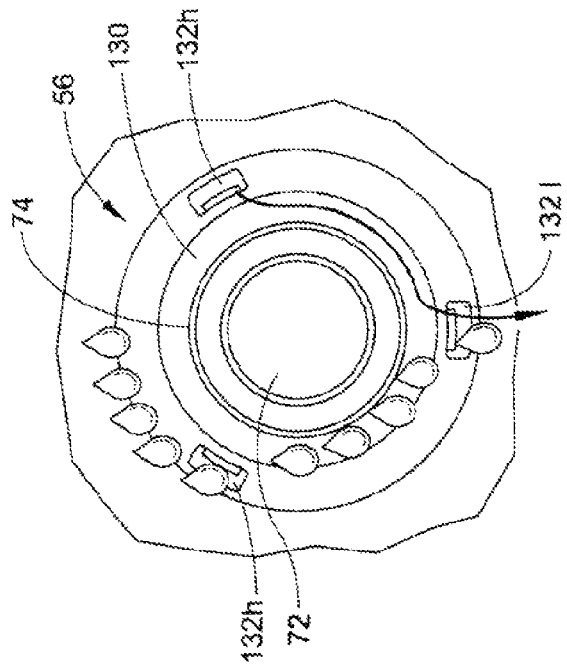
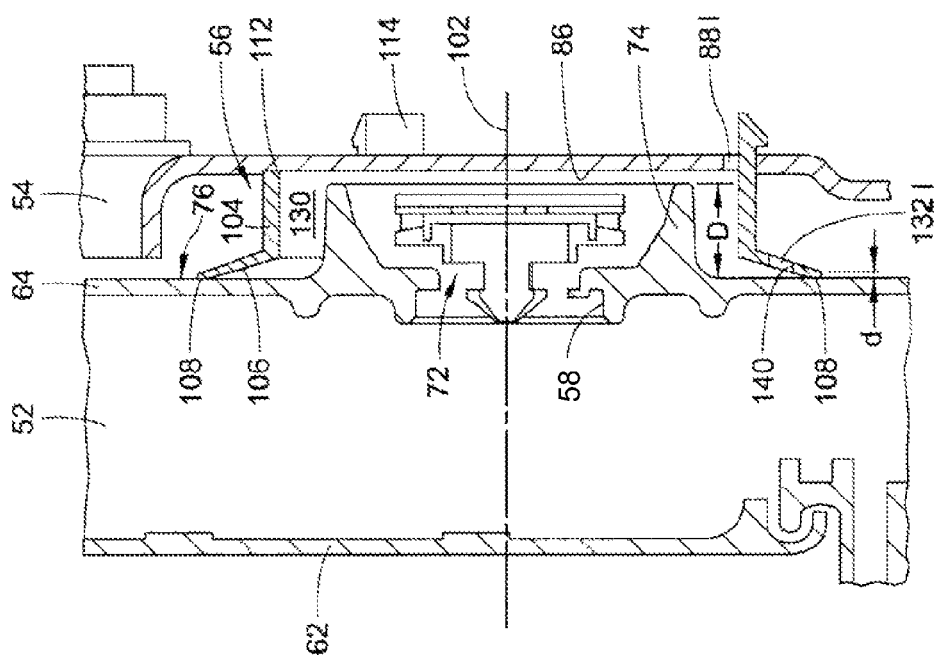
FIG. 8
FIG. 7

HOUSING STRUCTURE FOR VEHICLE ELECTRONIC CONTROL UNIT

BACKGROUND

Vehicles are equipped with an electronic control unit ("ECU") for controlling various devices and systems found on the vehicle. These units can be placed in the engine compartment. Placing the ECU in the engine compartment can expose the ECU to water, which can enter a case in which the ECU is housed thereby damaging the ECU.

With reference to FIG. 1, a known housing structure for a vehicle ECU includes a plastic cover 10 fastened to a metal bracket 12. With reference to FIG. 2, the cover 10 and the bracket 12 protect an ECU case 14 from direct moisture. An opening 16 is provided in the ECU case 14 for sensing atmospheric pressure. The opening 16 can also allow air to enter the ECU case 14 to cool the ECU housed within the case. A filter assembly 18 connects to the ECU case 14 to cover the opening 16. With reference to FIG. 3, the filter assembly 18, however, includes openings 20 which can allow for the ingress of water, depicted as droplets 22 in FIG. 3, into the ECU case 14, which can damage the ECU.

SUMMARY

An example of a housing structure for a vehicle electronic control unit ("ECU") that can overcome at least some of the aforementioned shortcomings includes an ECU case, a mounting bracket, and a seal ring. The ECU case is for housing a vehicle ECU and includes a ventilation opening. The mounting bracket connects with the ECU case and is configured to connect with an associated vehicle frame for mounting the ECU case to the associated vehicle frame. The seal ring surrounds the ventilation opening and seals against both the ECU case and the mounting bracket.

A method for mounting an electronic control unit ("ECU") case to a vehicle frame includes surrounding a ventilation opening of an ECU case with a seal ring, contacting an external surface of the ECU case adjacent the ventilation opening with the seal ring, contacting a surface of a mounting bracket with the seal ring, and fastening the mounting bracket to a vehicle frame. Contacting the external surface of the ECU case and contacting a surface of the mounting bracket with the seal ring traps the seal ring between the mounting bracket and the ECU case. Fastening the mounting bracket to the vehicle frame mounts the mounting bracket and the ECU case to the vehicle frame.

BRIEF DESCRIPTION OF THE DRAWINGS

FIG. 7 is a schematic cross-sectional view of the housing structure shown in FIG. 4 depicting a view similar to that shown in FIG. 3.

FIG. 8 is a schematic elevation view of the housing structure shown in FIG. 4 with the mounting bracket removed.

DETAILED DESCRIPTION

Figure 1:
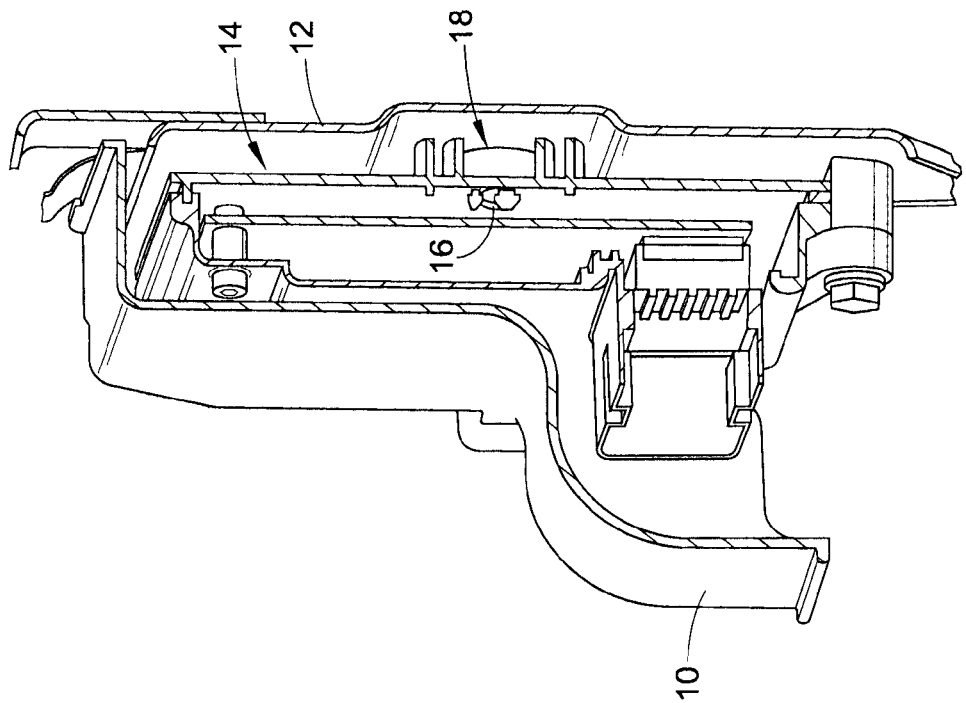
FIG. 1 is a perspective view of a known housing structure for a vehicle ECU.
Figure 2:
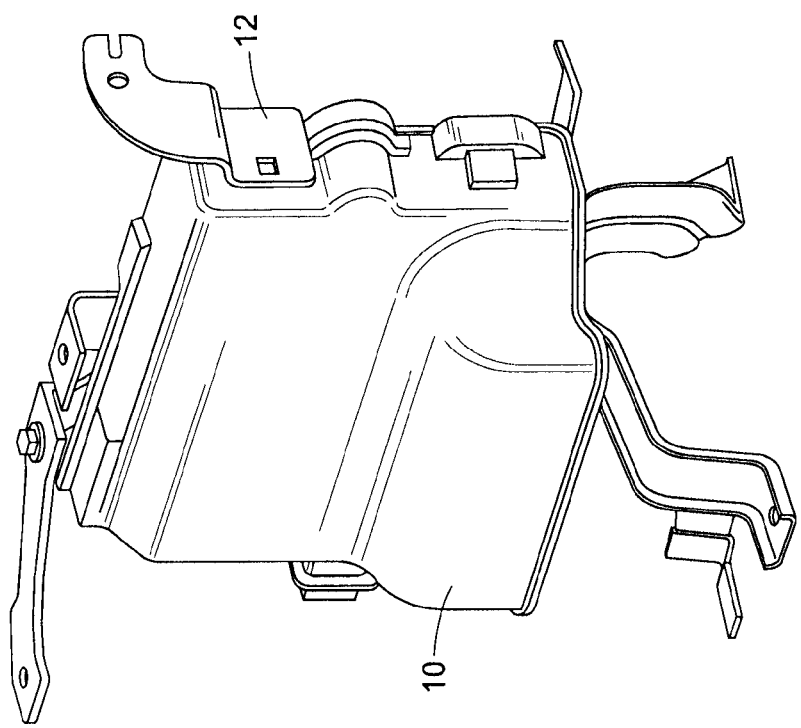
FIG. 2 is a cross-sectional view taken through the housing structure depicted in FIG. 1.
Figure 3:
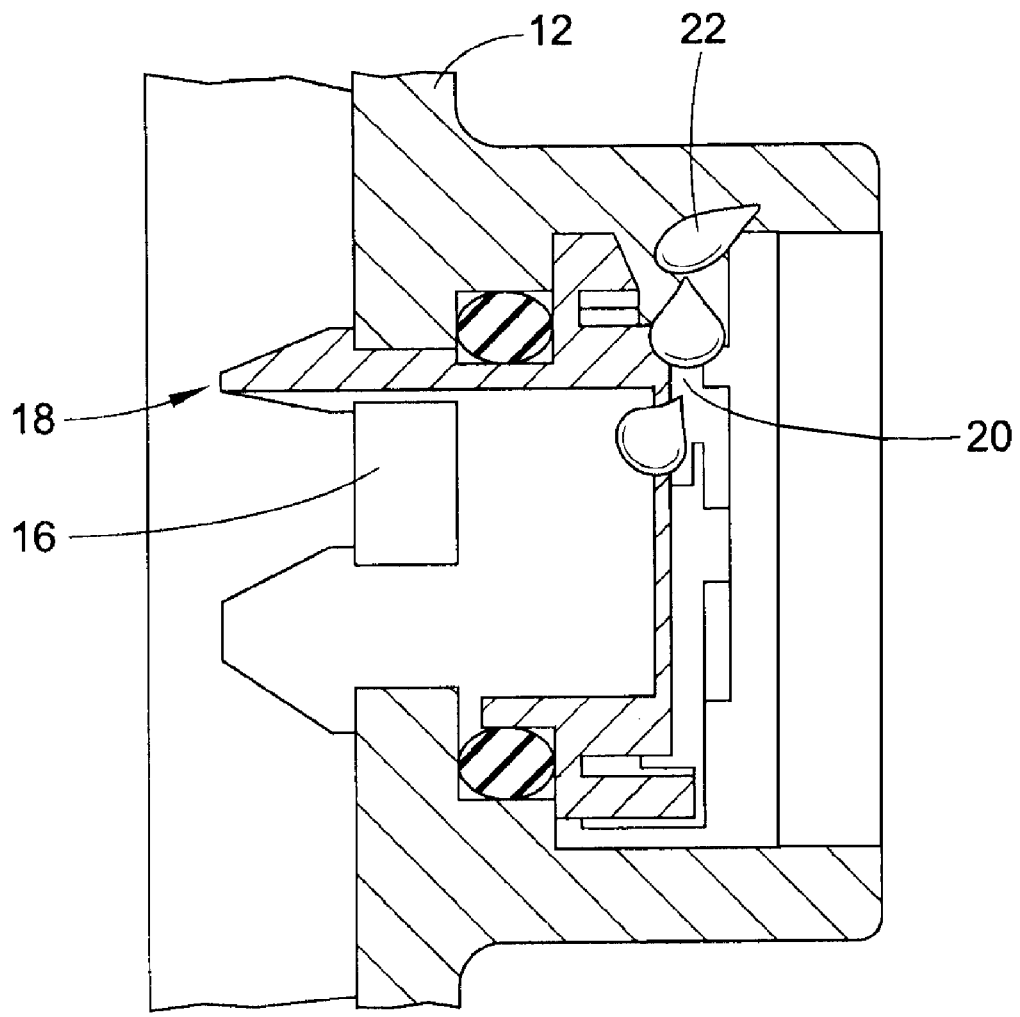
FIG. 3 is an enlarged schematic cross-sectional view depicting a filter assembly connected with an ECU case of the housing structure depicted in FIG. 1.
Figure 4:
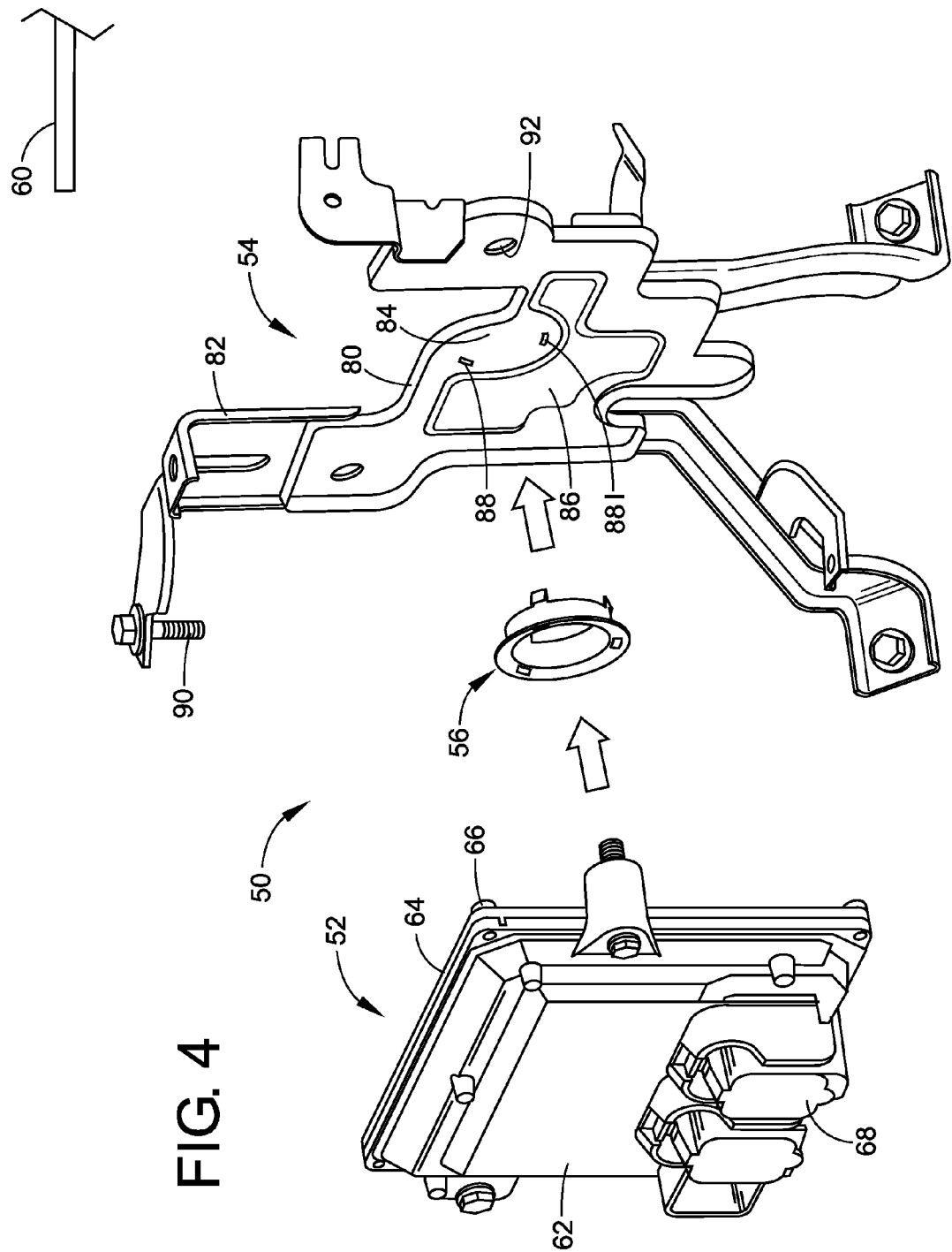
FIG. 4 is an exploded view of a housing structure for a vehicle ECU including an ECU case, a novel seal ring, and a mounting bracket.

With reference to FIG. 4, a housing structure 50 for a vehicle electronic control unit ("ECU") includes an ECU case 52 for housing a vehicle ECU (not visible, but disposed within the case), a mounting bracket 54 and a seal ring 56. The ECU case 52 is for housing a vehicle ECU in a watertight environment with the exception of a ventilation opening 58 (FIG. 7) formed in the case 52. The mounting bracket 54 connects with the case 52 and is configured to connect with an associated vehicle frame 60 (only a portion of which is depicted in FIG. 4) for mounting the case to the associated vehicle frame 60. The seal ring 56 surrounds the ventilation opening 58 and seals against both the ECU case 52 and the mounting bracket 54 in a manner to prevent or substantially inhibit moisture ingress into the ECU case.

In the embodiment illustrated in FIG. 4, the ECU case 52 can be disposed in an engine compartment of a vehicle. The ECU case 52 can be made from aluminum, plastic and/or another rigid material. In the illustrated embodiment, the ECU case 52 includes a first panel 62 attached to a second panel 64 via fasteners 66. A coupler 68 for providing electrical connections between the vehicle components controlled by the ECU and the ECU mounts to the first panel 62. The first panel 62 connects with the second panel 64 and the coupler 68 to form a watertight enclosure for the ECU. Seals (not shown) can be provided to facilitate the watertight connection. The ECU case 52 can be similar in configuration to known ECU cases.

With reference to FIG. 7, the second panel 64 is formed to include the ventilation opening 58. Similar to the known embodiment described above, a filter assembly 72 connects to the ECU case 52 at the second panel 64 and covers the opening 58. The ventilation opening 58 provides an opening through which air can enter into the ECU case 52 to allow the ECU to sense atmospheric pressure and to allow air to enter the ECU case to cool the ECU. An annular boss 74 extends from an external surface 76 of the ECU case 52, more particularly from an external surface of the second panel 64, and extends in an axial direction toward the mounting bracket 54. The seal ring 56 surrounds the annular boss 74 and cooperates with the external surface 76 in a manner that will be described in more detail below.

With reference back to FIG. 4, the mounting bracket 54 includes a base 80 and a plurality of mounting legs 82 that attach to the base. In the illustrated embodiment, the base 80 is generally flat while including slight indentations or undulations. The base 80 includes a generally circular recess 84 that provides a sealing surface 86 for the seal ring 56 to seal against the mounting bracket 54.

The mounting bracket 54 also includes a plurality of mounting apertures 88. In the illustrated embodiment, the mounting bracket 54 includes three mounting apertures 88, only two of which are visible in FIG. 4, each angularly spaced 120 degrees from one another. A fewer or a greater number of mounting apertures can be provided. In the illustrated embodiment, at least one of the mounting apertures 88, a lowermost aperture 88*l* in FIG. 4, is disposed at a six o'clock position when the mounting bracket 54 is mounted to the associated vehicle frame.

The plurality of mounting legs 82 extend from the base 80 and are shaped and configured to allow the mounting bracket 54 to attach to the associated vehicle frame (not shown). Even though a certain configuration is depicted for the mounting legs 82 in the illustrated embodiment, the mounting legs can take a number of different configurations depending upon the configuration of the vehicle frame to which the mounting bracket 54 will attach. Fasteners 90 depicted in FIG. 4 can provide the mechanism for attaching the mounting bracket 54 to the vehicle frame; however, the mounting bracket 54 can attach to the vehicle frame in other conventional manners, such as via welds. The mounting bracket 54 also includes a plurality of fastener openings 92, which in the depicted embodiment are formed in the base 80, for attaching the case 52 to the mounting bracket 54. The ECU case 52 can attach to the mounting bracket 54 in other conventional manners. In the illustrated embodiment, however, the ECU case 52 can attach to the mounting bracket 54 in such a manner so that the seal ring 56 forms a watertight seal where the seal ring contacts the ECU case 52 at the external surface 76 and where the seal ring contacts the mounting bracket 54 at the sealing surface 86.

Figure 5:
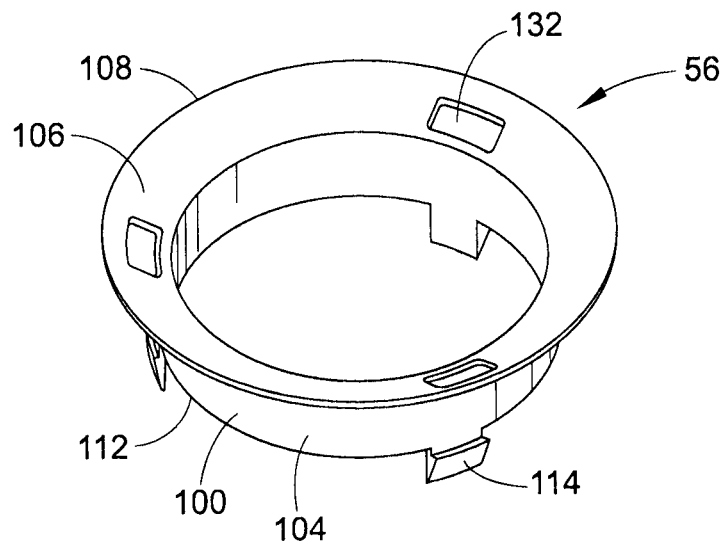
FIG. 5 is a perspective view of the seal ring shown in FIG. 4.
Figure 6:
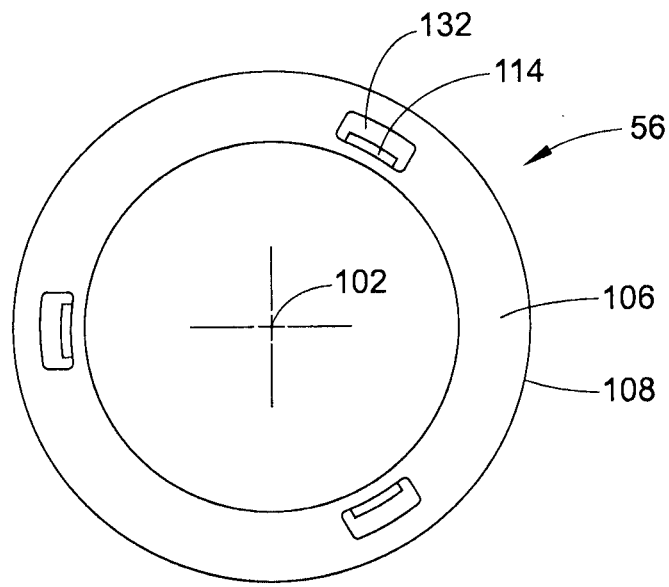
FIG. 6 is an end elevation view of the seal ring shown in FIG. 5.

With reference to FIG. 5, the seal ring 56 includes an annular wall 100 defined by a central axis 102 (FIG. 6). The seal ring 56 in the illustrated embodiment is made of plastic; however, other flexible materials that can seal against both the case 52 and the mounting bracket 54 could also be used. In the illustrated embodiment, the seal ring 56, more particularly the annular wall 100 thereof, includes a cylindrical section 104 and a flared section 106 both defined by the central axis 102. In the example depicted in FIGS. 4-8, the cylindrical section 104 takes the configuration a right circular cylinder. The flared section 106 extends axially away from the cylindrical section 104 and flares outwardly with respect to the central axis 102. With reference to FIG. 7, the seal ring 56 includes a first axial end 108 that seals against the external surface 76 of the ECU case 52 and a second axial end 112 that seals against the sealing surface 86 of the mounting bracket 54. The first axial end 108 of the seal ring 56 has a diameter that is greater than the second axial end 112.

The seal ring 56 also includes a plurality of mounting tabs 114 extending from an end of the cylindrical section 104 adjacent the mounting bracket 56, i.e., the second axial end 112 of the seal ring 56. With reference to FIG. 7, each mounting tab 114 is received in a respective mounting aperture 88 for connecting the seal ring 56 to the mounting bracket 54. The mounting tabs 114 extend in a direction generally parallel to the central axis 102 and away from the flared section 106, e.g., toward the mounting bracket 54. Like the mounting apertures 88, the mounting tabs 114 are angularly spaced 120 degrees apart from one another in the illustrated embodiment so that each mounting tab 114 is received in a respective mounting aperture 88 for connecting the seal ring 56 to the mounting bracket 54.

As mentioned above, the seal ring 56 is made from a flexible material, e.g., plastic. The ECU case 52 connects with the mounting bracket 54 in such a manner that the flared section 106 deflects in an axial direction parallel to the central axis 102 of the seal ring 56 when in contact with and sealed against the case 52 and the mounting bracket 54. The seal ring 56 connects with the mounting bracket 54 and the mounting bracket 54 connects with the ECU case 52 in a manner such that the seal ring 56, and more particularly the annular wall 100 thereof, is radially offset from the annular boss 74 to define an annular gap 130 defined between the annular boss 74 and the seal ring 56.

With reference back to FIG. 5, the seal ring 56 includes a plurality of radial openings 132 extending through the annular wall 100, and more particularly with reference to the illustrated embodiment extending through the flared section 106. In other words, the seal ring 56 includes the annular wall 110 and at least one radial opening, e.g., the radial openings 132, extending through the annular wall for communication with the annular gap 130 (see FIG. 7).

In the illustrated embodiment, each radial opening 132 is radially aligned with a respective mounting tab 112. Accordingly, the radial openings 132 are angularly spaced 120 degrees from one another in the depicted example. Also in the illustrated embodiment, the plurality of mounting tabs 112, the plurality of mounting apertures 88 and the plurality of radial openings 132 are aligned such that at least one radial opening, i.e., the lowermost radial opening 132*l* for the orientation shown in FIG. 8, is disposed at a six o'clock position when the case 52 and the mounting bracket 54 are mounted to the associated vehicle frame. Moreover, in the illustrated embodiment an additional radial opening, i.e., the upper radial openings 132*h* shown in FIG. 8, is/are disposed radially above the three o'clock position or the nine o'clock position when the case 52 and the mounting bracket 54 are mounted to the associated vehicle frame.

The positioning of the radial openings 132 allows water that enters the upper radial openings 132*h* to drain through the annular gap 130 and exit through the lower radial opening 132*l* at the six o'clock position without entering into the case 52. The annular boss 74 formed on the second panel 64 of the case 52 also directs any water that enters through the upper radial openings 132*h* toward the lowermost radial opening 132*l*. At least one radial opening, the lowermost radial opening 132*l* in FIG. 8, can be disposed at the six o'clock position when the case 52 and the mounting bracket 54 are mounted to the associated vehicle frame to prevent or substantially inhibit moisture ingress into the case 52. At least one radial opening, and in the illustrated embodiment each radial opening, is disposed adjacent an end of the annular wall 100 of the seal ring 56 that seals against the case 52, i.e. the first end 108. With reference to FIG. 7, the annular boss 74 extends into the seal ring 56 an axial distance D from the first end 108 of the annular wall 110 that seals against the external surface 76 of the case 52. Also, an axially outermost edge 140 of the lower radial opening 132*l* (per the orientation shown in FIG. 7) is offset from the first end 108 of the annular wall 100 a distance d, which is less than the distance D. Accordingly, the axial location of the lowermost radial opening 132*l* with respect to the annular boss 74 can further inhibit moisture into the case 52. By positioning the lowermost radial opening 132*l* on the flared section 106, any water that enters through the upper radial openings 132*h* is encouraged to travel toward the lowermost radial opening due to gravity. This is desirable because the central axis 102 of the seal ring 56 is generally parallel to a direction of travel of the vehicle, i.e., the central axis 102 is typically horizontally oriented.

A method for mounting an ECU case, e.g. the ECU case 52, to a vehicle frame includes surrounding a ventilation opening, e.g., the ventilation opening 58, of the ECU case 52 with a seal ring, e.g. the seal ring 56. The method further includes contacting an external surface, e.g. the external surface 76, of the ECU case adjacent the ventilation opening with the seal ring. The method further includes contacting a surface, e.g. the sealing surface 86, of a mounting bracket, e.g. the mounting bracket 54, with the seal ring trapping the seal ring between the mounting bracket and the ECU case. The method further includes fastening the mounting bracket to a vehicle frame (not shown) to mount the mounting bracket and the ECU case to the vehicle frame.

Surrounding the ventilation opening of the ECU case with the seal ring can further include surrounding an annular boss, e.g., the annular boss 74 of the ECU case 52, with the seal ring wherein the seal ring is radially offset from the annular boss to define an annular gap, e.g., the annular gap 130 between the seal ring 56 and the annular boss 74. Surrounding the ventilation opening of the ECU case with the seal ring can further include positioning a central axis, e.g., the central axis 102 of the seal ring 56, in a direction generally parallel to a direction of travel of a vehicle (not shown) including the vehicle frame (not shown)

The method can further include positioning a radial opening, e.g., one of the radial openings 132, extending through an annular wall, e.g., the annular wall 100 of the seal ring 56, adjacent a six o'clock position. The method can further include axially deforming a section of the seal ring 56. For example, as mentioned above the flared section 106 of the seal ring 56 axially deflects in a direction generally parallel to the central axis 102 of the seal ring 56. This axial deflection is similar to the action of a Belleville spring.

The method for mounting the ECU case to the vehicle frame can also include inserting a mounting tab, e.g., at least one of the mounting tabs 114 on the seal ring 56, into a mounting aperture, e.g., the mounting apertures 88 in the mounting bracket 54. As mentioned above, the mounting tabs 114, the mounting apertures 88 and the radial openings 132 can be aligned such that at least one radial opening is disposed at a six o'clock position when the case 52 and the mounting bracket 54 are mounted to the vehicle frame.

A housing structure for a vehicle ECU and a method for mounting an ECU case to a vehicle frame have been described above with particularity. Modifications and alterations will occur to those upon reading and understanding the preceding detailed description. The invention, however, is not limited to only the embodiments described above. Instead, the invention is broadly defined by the appended claims and the equivalents thereof.

It will be appreciated that several of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A housing structure for a vehicle electronic control unit ("ECU") comprising:
   an ECU case for housing a vehicle ECU, the ECU case including a ventilation opening;
   a mounting bracket connected with the ECU case for connecting with an associated vehicle frame for mounting the ECU case to the associated vehicle frame; and
   a seal ring separate from the ECU case and surrounding the ventilation opening and sealing against both the ECU case and the mounting bracket, wherein the seal ring includes a plurality of radial openings.

2. The structure of claim 1, wherein the seal ring includes a cylindrical section and a flared section both defined by a central axis.

3. The structure of claim 2, wherein the seal ring is made from a flexible material and the flared section deflects in an axial direction parallel to the central axis of the seal ring when in contact with and sealed against the ECU case and the mounting bracket.

4. The structure of claim 2, wherein the plurality of radial openings each extend through the flared section.

5. The structure of claim 1, wherein the seal ring includes a plurality of mounting tabs extending from an end of the cylindrical section adjacent the mounting bracket and the mounting bracket includes a plurality of mounting apertures, each mounting tab being received in a respective mounting aperture for connecting the seal ring to the mounting bracket.

6. The structure of claim 5, wherein each radial opening is radially aligned with one of the respective mounting tabs.

7. The structure of claim 5, wherein the plurality of mounting tabs, the plurality of mounting apertures and the plurality of radial openings are aligned such that at least one radial opening of the plurality of radial openings is disposed at a six o'clock position on the seal ring when the ECU case and the mounting bracket are mounted to the associated vehicle frame.

8. The structure of claim 1, further comprising a filter assembly covering the ventilation hole.

9. The structure of claim 1, wherein the ECU case includes an annular boss surrounding the ventilation opening and the seal ring is radially offset from the annular boss to define an annular gap defined between the annular boss and the seal ring.

10. The structure of claim 9, wherein the seal ring includes an annular wall and each radial opening extending through the annular wall for communication with the annular gap, a first radial opening of the plurality of radial openings being disposed at a six o'clock position on the seal ring when the ECU case and the mounting bracket are mounted to the associated vehicle frame.

11. The structure of claim 10, wherein the first radial opening is disposed adjacent a first end of the annular wall, wherein the first end seals against the case.

12. The structure of claim 11, wherein the boss extends into the seal ring an axial distance D from the first end and an axially outermost edge of the first radial opening is offset from the first end of the annular wall a distance d, which is less than the distance D.

13. A housing structure for a vehicle electronic control unit ("ECU") comprising:
   an ECU case for housing a vehicle ECU, the ECU case including a ventilation opening;
   a mounting bracket connected with the ECU case for connecting with an associated vehicle frame for mounting the ECU case to the associated vehicle frame; and
   a seal ring surrounding the ventilation opening and sealing against both the ECU case and the mounting bracket, wherein the seal ring includes a plurality of radial openings,
   wherein the ECU case includes an annular boss surrounding the ventilation opening and the seal ring is radially offset from the annular boss to define an annular gap defined between the annular boss and the seal ring;
   wherein the seal ring includes an annular wall and each radial opening extending through the annular wall for communication with the annular gap, a first radial opening of the plurality of radial openings being disposed at a six o'clock position on the seal ring when the ECU case and the mounting bracket are mounted to the associated vehicle frame;
   wherein a second radial opening of the plurality of radial openings is disposed radially above a three o'clock position or a nine o'clock position on the seal ring when the ECU case and the mounting bracket are mounted to the associated vehicle frame.

14. A method for mounting an electronic control unit ("ECU") case to a vehicle frame comprising:

surrounding a ventilation opening of an ECU case with a seal ring, which is separate from the ECU case;

positioning a radial opening extending through an annular wall of the seal ring adjacent a six o'clock position on the seal ring;

contacting an external surface of the ECU case adjacent the ventilation opening with the seal ring;

contacting a surface of a mounting bracket with the seal ring trapping the seal ring between the mounting bracket and the ECU case; and fastening the mounting bracket to a vehicle frame to mount the mounting bracket and the ECU case to the vehicle frame.

15. The method of claim 14, wherein surrounding the ventilation opening of the ECU case with the seal ring further includes surrounding an annular boss of the ECU case with seal ring wherein the seal ring is radially offset from the annular boss to define an annular gap between the seal ring and the annular boss.

16. The method of claim 14, wherein surrounding the ventilation opening of the ECU case with the seal ring further includes positioning a central axis of the seal ring in a direction generally parallel to a direction of travel of a vehicle including the vehicle frame.

17. The method of claim 14, further comprising axially deforming a section of the seal ring.

18. The method of claim 14, further comprising inserting a mounting tab on the seal ring into a mounting aperture in the mounting bracket.

19. The method of claim 14, wherein positioning a radial opening extending through an annular wall of the seal ring includes positioning a first radial opening of a plurality of radial openings extending through annular wall of the seal ring at the six o'clock position on the seal ring, and the method further includes positioning a second radial opening of the plurality of radial openings extending through annular wall of the seal ring above a three o'clock position or a nine o'clock position on the seal ring when the ECU case and the mounting bracket are mounted to the associated vehicle frame.

* * * * *